(12) United States Patent
Uchida

(10) Patent No.: US 11,051,420 B1
(45) Date of Patent: Jun. 29, 2021

(54) ELECTRONIC DEVICE

(71) Applicant: SHINDENGEN ELECTRIC MANUFACTURING CO., LTD., Tokyo (JP)

(72) Inventor: Yoshitaka Uchida, Saitama-ken (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 16/709,686

(22) Filed: Dec. 10, 2019

(51) Int. Cl.
*H05K 1/14* (2006.01)
*H05K 7/14* (2006.01)
*B60R 16/02* (2006.01)

(52) U.S. Cl.
CPC ........... *H05K 7/1427* (2013.01); *B60R 16/02* (2013.01)

(58) Field of Classification Search
USPC ................................ 361/736, 747, 752, 759
See application file for complete search history.

(56) References Cited

U.S. PATENT DOCUMENTS

| 10,680,377 | B2* | 6/2020 | Ichikawa | H01R 12/721 |
| 2005/0270753 | A1* | 12/2005 | Morisada | H05K 5/0039 361/752 |
| 2015/0351262 | A1* | 12/2015 | Jorgensen | H05K 5/0043 312/223.1 |
| 2017/0194731 | A1* | 7/2017 | Van Rijswijk | H05K 3/366 |

FOREIGN PATENT DOCUMENTS

JP 2015-233087 A 12/2015

* cited by examiner

*Primary Examiner* — Hung S. Bui
(74) *Attorney, Agent, or Firm* — Marshall, Gerstein & Borun LLP

(57) ABSTRACT

An electronic device includes a board having a mounting surface for an electronic component, a case having an opening for insertion of the board into the case and configured to house the board inserted through the opening, and a cover fixed to the case so as to close the opening. The board also has at least one deformable device formed on an end side of the board and configured to be elastically deformable in a direction orthogonal to the mounting surface. The deformable device comes into contact with the case or the cover in a state of being elastically deformed to hold the board in a fixed state in a storage space formed through fixation of the cover to the case when the board is housed in the storage space.

9 Claims, 15 Drawing Sheets

ELECTRONIC DEVICE

FIELD

The present invention relates to an electronic device.

BACKGROUND

Electronic devices which control a piece of electrical equipment mounted on a vehicle include one which includes, in a case, a case-side board holder having a gap, into which a board is to be inserted and in which the board is to be held, as a structure to hold a board in the case (see, for example, JP2015-233087A). In an electronic device including such a case-side board holder, a gap of the case-side board holder is formed to be larger than a thickness of a board so as to ensure insertion of a board into the gap of the case-side board holder, in view of manufacturing variations.

Since the gap of the case-side board holder is formed to be larger than a thickness of a board in the above-described electronic device including the case-side board holder, the electronic device can hold a substrate even in the presence of manufacturing variations. However, a board held in the case-side board holder may shake due to vehicle vibration to generate an unusual noise.

The present invention has been made to solve the above-described problem, and has its object to provide an electronic device capable of preventing a board from shaking in a case to generate an unusual noise.

An electronic device according to the present invention includes a board having a mounting surface for an electronic component, a case having an opening for insertion of the board into the case and configured to house the board inserted through the opening, and a cover fixed to the case so as to close the opening. The board has at least one deformable device formed on an end side of the board and configured to be elastically deformable in a direction orthogonal to the mounting surface, and the deformable device comes into contact with the case or the cover in a state of being elastically deformed to hold the board in a fixed state in a storage space formed through fixation of the cover to the case when the board is housed in the storage space.

The electronic device according to the present invention is configured such that the deformable device formed at the board comes into contact with the case or the cover in the state of being elastically deformed to hold the board in the fixed state in the storage space when the board is housed in the storage space formed through fixation of the cover to the case. This makes it possible to prevent the board from shaking in the case to generate an unusual noise.

DETAILED DESCRIPTION

Figure 1:
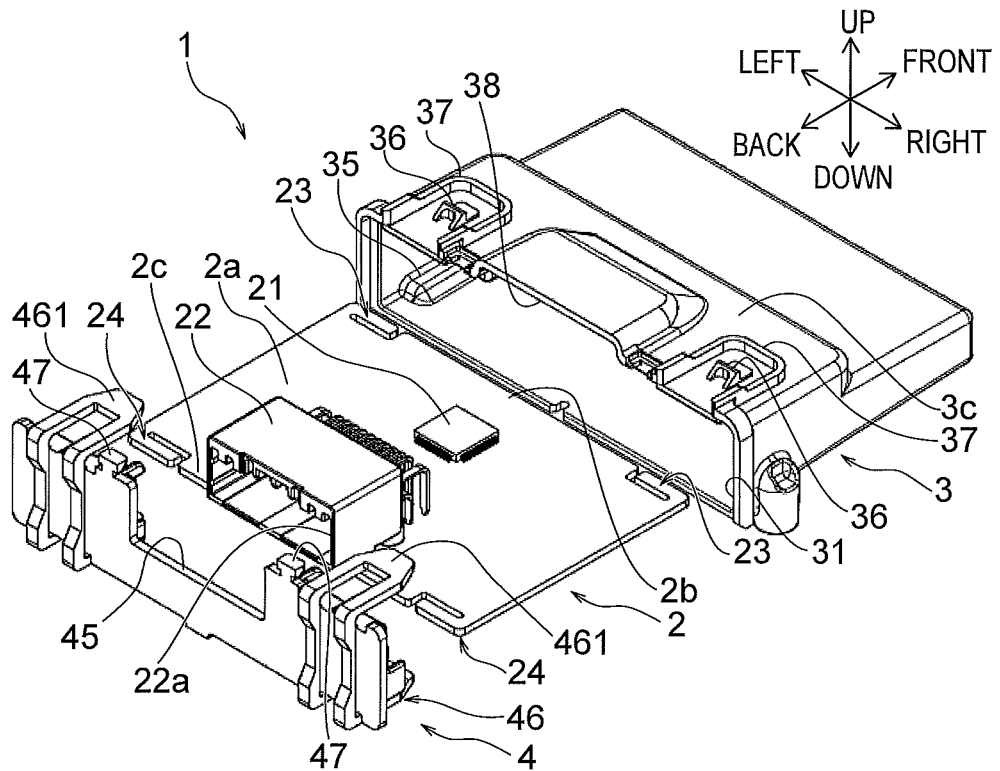
FIG. 1 is an exploded perspective view showing an electronic device according to a first embodiment.

Embodiments of the present invention will be described below with reference to the drawings. Note that, for example, a term such as "parallel" or "orthogonal," a value of a length or an angle, or the like used in a description of the embodiments to specify a shape or a geometric condition and the degree of the shape or geometric condition is not bound by an exact meaning thereof and is assumed to be interpreted as including a range within which a similar function can be expected. A same portion or a portion having a similar function in the drawings to be referred to in the embodiments is denoted by a same or similar reference numeral, and a repetitive description thereof may be omitted. Dimensional ratios in the drawings may be different from actual ratios or part of a configuration may be omitted, for convenience of description. In the embodiments, directions indicated by an up down arrow, a left right arrow, and a front back arrow shown in FIG. 1 and the like are defined as a vertical direction, a lateral direction, and a longitudinal direction for convenience of description, and a position and orientation of a constituent portion of an electronic component will be described.

First Embodiment

An electronic device 1 according to a first embodiment is an electronic control device for controlling a piece of electrical equipment, such as a motor or a suspension damper, mounted on a vehicle. As shown in FIG. 1, the electronic device 1 includes a board 2 on which an electronic component 21 is mounted, a case 3 which houses the board 2, and a cover 4 which is fixed to the case 3.

[Board 2]

Figure 2:
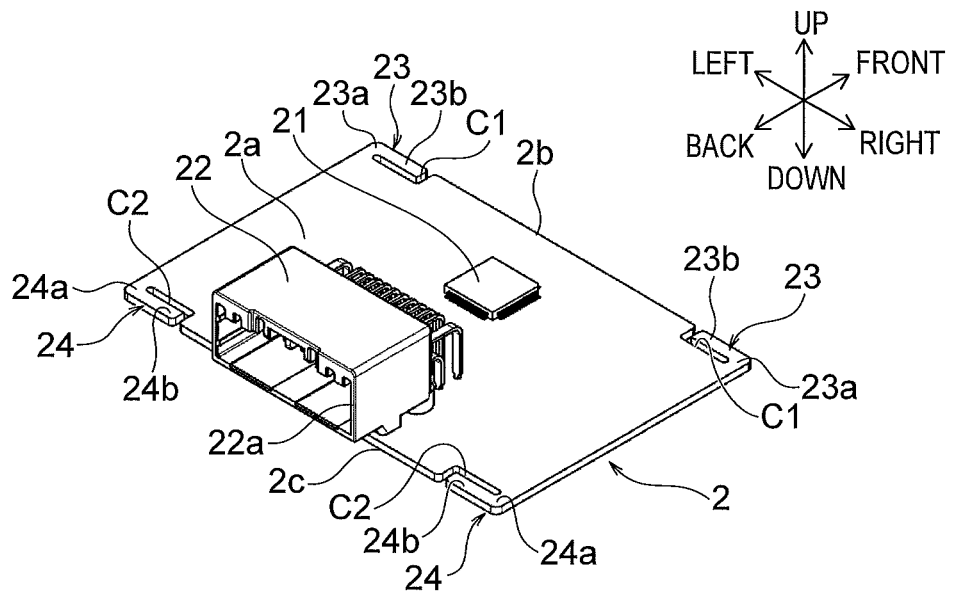
FIG. 2 is a perspective view of a board constituting part of the electronic device.
Figure 3:
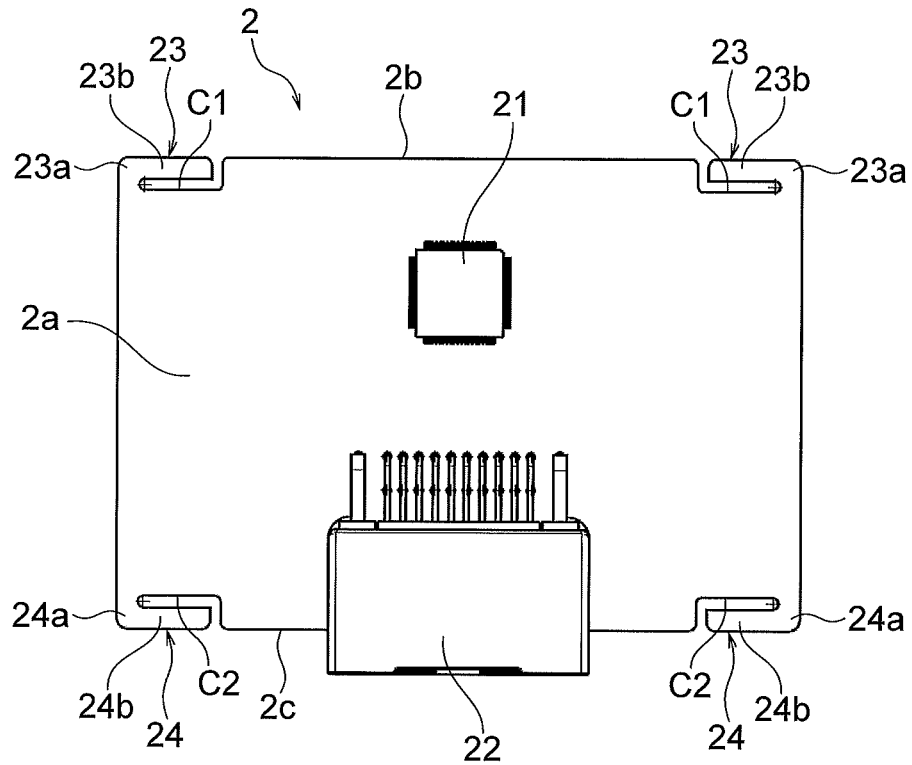
FIG. 3 is a plan view of the board constituting part of the electronic device.

As shown in FIGS. 2 and 3, the board 2 is a rectangular-plate-shaped printed wiring board which has a predetermined length and a predetermined width in the longitudinal direction and the lateral direction, and has a predetermined thickness in the vertical direction. The electronic component 21 and a connector 22 are mounted on a mounting surface 2a which is an upper surface of the board 2. The electronic component 21 is a component which is driven by power supplied from a power source (e.g., a battery) mounted on the vehicle to execute control of the piece of electrical equipment mounted on the vehicle. Although FIG. 2 and the like show a state where only one electronic component 21 is mounted on the mounting surface 2a, various electronic components are actually mounted on the mounting surface 2a. Various electronic components are also mounted on a lower surface of the board 2. The connector 22 has a box-shaped housing which opens rearward and a plurality of connection terminals which are fixed to the housing. The connector 22 is mounted on the mounting surface 2a by inserting end sides of the plurality of connection terminals protruding from the housing into a through-hole extending vertically through the board 2 and soldering the end sides. A connector on a harness (cable) side which is linked to the power source and the piece of electrical equipment mounted on the vehicle is inserted into and connected to a connection opening 22a which opens rearward of the connector 22 (the housing). A wiring pattern which electrically connects the electronic component 21, the connector 22, and the like is formed on the mounting surface 2a of the board 2. A resist layer for protecting the wiring pattern and the like is provided on the mounting surface 2a.

Respective deformable devices 23 and 24 which are elastically deformable in the vertical direction are formed at four corners of the board 2. More specifically, two front-side deformable devices 23 are formed on a side with a front end 2b of the board 2. One front-side deformable device 23 is formed on each of two left and right sides at the front end 2b of the board 2. The front-side deformable device 23 is formed on the front end 2b side of the board 2 by making, in the board 2, a notch C1 L-shaped in plan view which extends rearward from the front end 2b and then extends in the lateral direction from a rear end. The front-side deformable device 23 thus formed has a deformable base 23a which is linked to the board 2 and extends frontward and a deformable arm 23b which extends in the lateral direction (toward a center of the board 2) from a front of the deformable base 23a. With the deformable base 23a and the deformable arm 23b, the front-side deformable device 23 is formed to be L-shaped in plan view and is cantilevered with respect to the board 2. The board 2 is formed like a thin plate of a resin material or the like. For this reason, the front-side deformable device 23 is elastically deformable such that the distal end side of the deformable arm 23b moves in the vertical direction using, as a fulcrum, at least one of a joint between the board 2 and the deformable base 23a and a joint between the deformable base 23a and the deformable arm 23b when force acts on a distal end (free end) side of the deformable arm 23b in the vertical direction.

Two rear-side deformable devices 24 are formed on a side with a rear end 2c of the board 2. One rear-side deformable device 24 is formed on each of two left and right sides at the rear end 2c of the board 2. The rear-side deformable device 24 is formed on the rear end 2c side of the board 2 by making, in the board 2, a notch C2 L-shaped in plan view which extends frontward from the rear end 2c and then extends in the lateral direction from a front end. The rear-side deformable device 24 thus formed has a deformable base 24a which is linked to the board 2 and extends rearward and a deformable arm 24b which extends in the lateral direction (toward the center of the board 2) from the deformable base 24a. With the deformable base 24a and the deformable arm 24b, the rear-side deformable device 24 is also formed to be L-shaped in plan view and is cantilevered with respect to the board 2. As described above, the board 2 is formed like a thin plate of a resin material or the like. For this reason, the rear-side deformable device 24 is elastically deformable such that a distal end (free end) side of the deformable arm 24b moves in the vertical direction using, as a fulcrum, at least one of a joint between the board 2 and the deformable base 24a and a joint between the deformable base 24a and the deformable arm 24b when force acts on the distal end side of the deformable arm 24b in the vertical direction. Note that although the resist layer is provided on the mounting surface 2a, as described above, a resist layer may not be provided at portions of the mounting surface 2a where the front-side and rear-side deformable devices 23 and 24 are formed to facilitate elastic deformation of the front-side and rear-side deformable devices 23 and 24. Deformable devices similar to the front-side and rear-side deformable devices 23 and 24 may be formed on left and right end sides of the board 2.

[Case 3]

Figure 4:
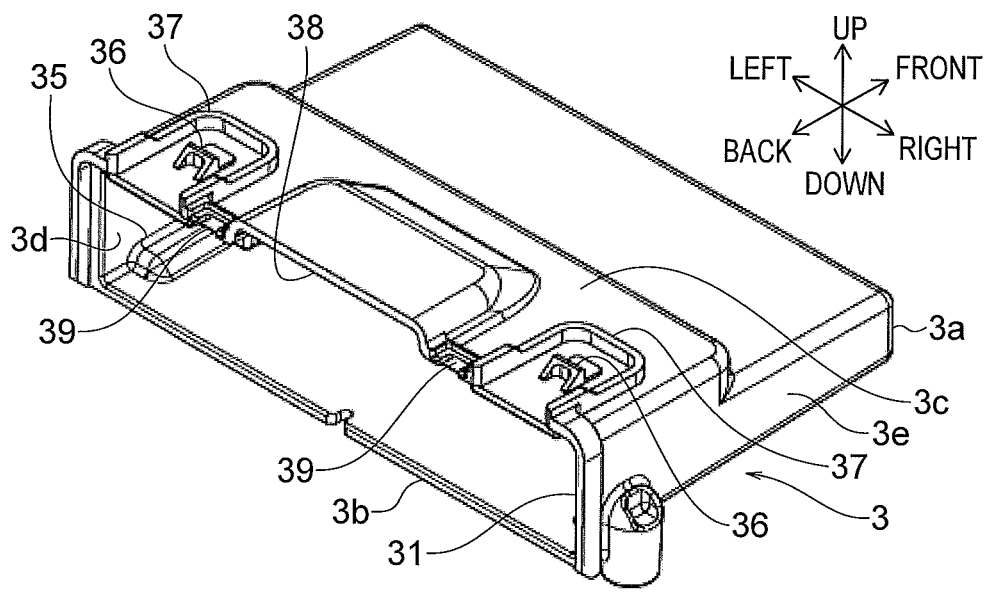
FIG. 4 is a perspective view of a case constituting part of the electronic device.
Figure 5:
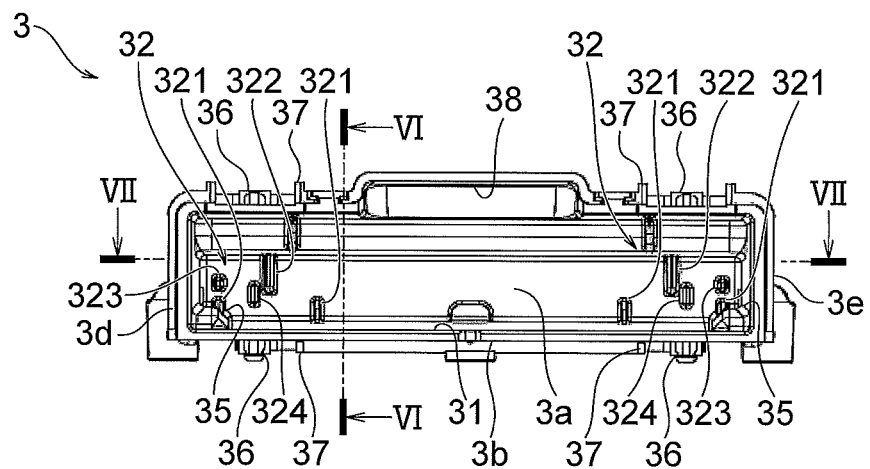
FIG. 5 is a front view of the case constituting part of the electronic device.

As shown in FIGS. 4 and 5, the case 3 is a rectangular box-shaped member made of resin which is composed of a front wall 3a, a lower wall 3b, an upper wall 3c, a left wall 3d, and a right wall 3e. The case 3 has a case-side opening 31 which opens rearward. The case 3 is configured to house the board 2 inserted through the case-side opening 31. The board 2 passes through the case-side opening 31 in a direction from the front end 2b side along the mounting surface 2a, is inserted into the case 3, and is housed.

The case 3 has two sets of case-side board holders 32 provided at an inner surface of the front wall 3a which faces the case-side opening 31 inside the case 3. One set of case-side board holders 32 is provided on each of two left and right sides at the inner surface of the front wall 3a. One set of case-side board holders 32 has two case-side first holders 321 which are arranged with a predetermined distance therebetween in the lateral direction at the front wall 3a and one case-side second holder 322 which is arranged between the two case-side first holders 321.

Figure 6:
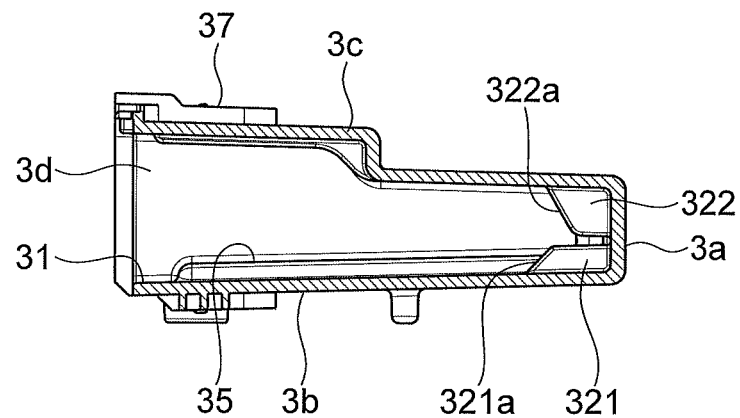
FIG. 6 is a cross sectional view taken along line VI-VI in FIG. 5.
Figure 7:
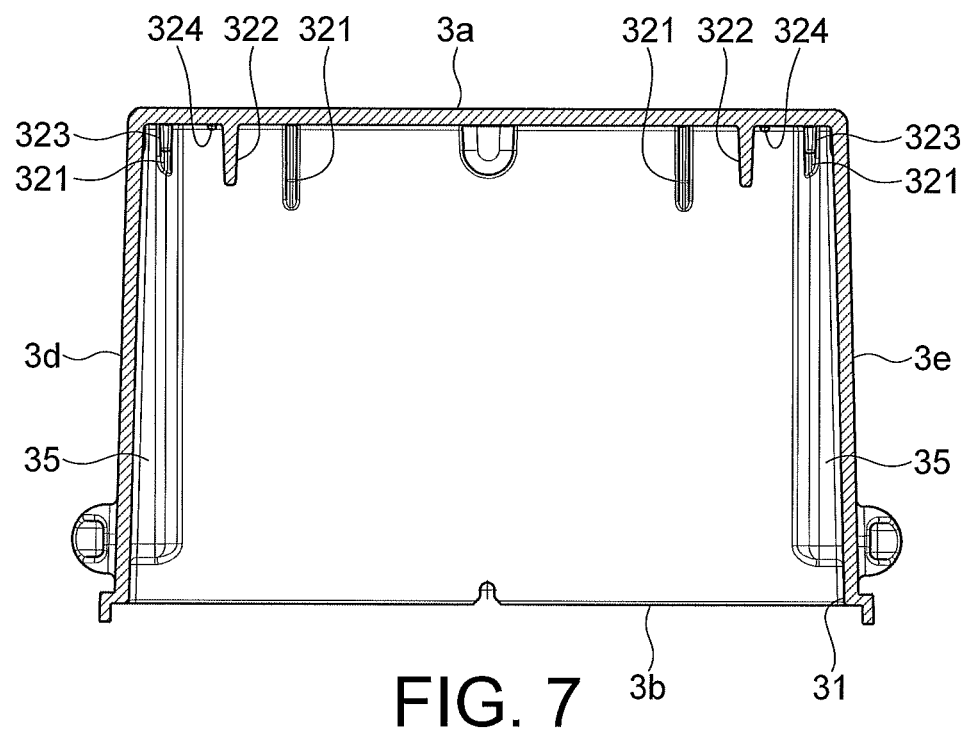
FIG. 7 is a cross sectional view taken along line VII-VII in FIG. 5.

As shown in FIGS. 5 to 7, the two case-side first holders 321 are each shaped like a flat plate which extends from the inner surface of the front wall 3a toward the case-side opening 31 (rearward) and is provided with an orientation having the lateral direction as a thickness direction. Of the two case-side first holders 321, the case-side first holder 321 arranged on a laterally central side of the case 3 is longer in a dimension extending toward the case-side opening 31 (rearward) than the case-side first holder 321 arranged on a side with the left or right wall 3d or 3e (see FIG. 7). Respective inclined surfaces 321a which incline downward toward a rear are formed on rear end sides of the two case-side first holders 321 (see FIG. 6).

The case-side second holder 322 is arranged between and above the two case-side first holders 321 at the inner surface of the front wall 3a. Like the case-side first holders 321, the case-side second holder 322 is shaped like a flat plate which extends from the inner surface of the front wall 3a toward the case-side opening 31 (rearward) and is provided with an orientation having the lateral direction as a thickness direction. A dimension extending toward the case-side opening 31 of the case-side second holder 322 is shorter than that of the case-side first holder 321 arranged on the laterally central side of the case 3 and is longer than that of the case-side first holder 321 arranged on the left or right wall 3d or 3e side (see FIG. 7). An inclined surface 322a which inclines upward toward the rear is formed on a rear end side of the case-side second holder 322 (see FIG. 6). The two case-side first holders 321 and the case-side second holder 322 are arranged with a distance smaller than the thickness of the board 2 therebetween in the vertical direction. In other words, a distance in the vertical direction (a distance d1 shown in FIG. 14) between upper ends of the two case-side first holders 321 and a lower end of the case-side second holder 322 is a distance smaller than the thickness of the board 2.

One set of case-side board holders 32 further includes a case-side third holder 323 which is arranged above the case-side first holder 321 arranged on the left or right wall 3d or 3e side at the inner surface of the front wall 3a. Like the holders 321 and 322, the case-side third holder 323 is shaped like a flat plate which extends from the inner surface of the front wall 3a toward the case-side opening 31 (rearward) and is provided with an orientation having the lateral direction as a thickness direction. A dimension extending toward the case-side opening 31 of the case-side third holder 323 is shorter than that of the case-side first holder 321 arranged on the left or right wall 3d or 3e side (see FIG. 7). The case-side first holder 321 arranged on the left or right wall 3d or 3e side and the case-side third holders 323 are arranged with a distance equal to (or slightly larger than) the thickness of the board 2 in the vertical direction. In other words, the board 2 can be inserted into between the upper end of the case-side first holder 321 and a lower end of the case-side third holder 323, and the board 2 is held between the case-side first holder 321 and the case-side third holder 323.

One set of case-side board holders 32 further includes a convex board front end positioning projection 324 which is arranged between the upper ends of the two case-side first holders 321 and the lower end of the case-side second holder 322 at the inner surface of the front wall 3a. The board front end positioning projection 324 is arranged between the two case-side first holders 321 and closer to the left or right wall 3d or 3e than the case-side second holder 322. The board front end positioning projection 324 is configured to come into contact with the distal end side of the deformable arm 23b of the front-side deformable device 23 at the board 2 to press the deformable arm 23b in a direction opposite to an insertion direction (rearward) when the board 2 is inserted into the case 3. Note that the board front end positioning projection 324 may be changed in arrangement in the lateral direction to another position.

The case 3 includes two board insertion guides 35 which are provided on two left and right sides, respectively, at an inner surface of the lower wall 3b inside the case 3. The two board insertion guides 35 each extend from a position close to the case-side opening 31 toward the inner surface of the front wall 3a at the inner surface of the lower wall 3b. A height (a height from the inner surface of the lower wall 3b) of the board insertion guide 35 is slightly lower than (or generally equal to) those of the upper ends of the two case-side first holders 321 (see FIGS. 5 and 6).

As shown in FIG. 4, the case 3 includes two convex case-side lockers 36 which are provided on two left and right sides, respectively, at a position close to the case-side opening 31 and two U-shaped lock walls 37 which are each provided so as to surround two left and right sides and a front side of the case-side locker 36 at an outer surface of the upper wall 3c. Two case-side lockers 36 and two lock walls 37 are also provided at the lower wall 3b of the case 3 (see FIG. 5). The case 3 further includes, at the upper wall 3c, a connector receiver 38 in a shape bulging upward at a lateral center at a position close to the case-side opening 31 and two lug receivers 39 which are provided on two left and right sides, respectively, of the connector receiver 38. The two lug receivers 39 each extend vertically through the upper wall 3c and have a notched shape which opens rearward. The upper wall 3c of the case 3 has a stepped shape in which a rear-side portion extending from a longitudinal center is higher than a front-side portion.

[Cover 4]

Figure 8:
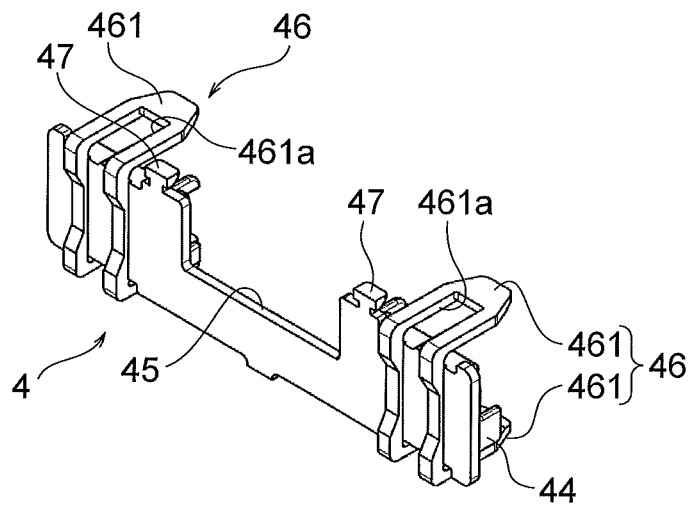
FIG. 8 is a front perspective view of a cover constituting part of the electronic device.
Figure 9:
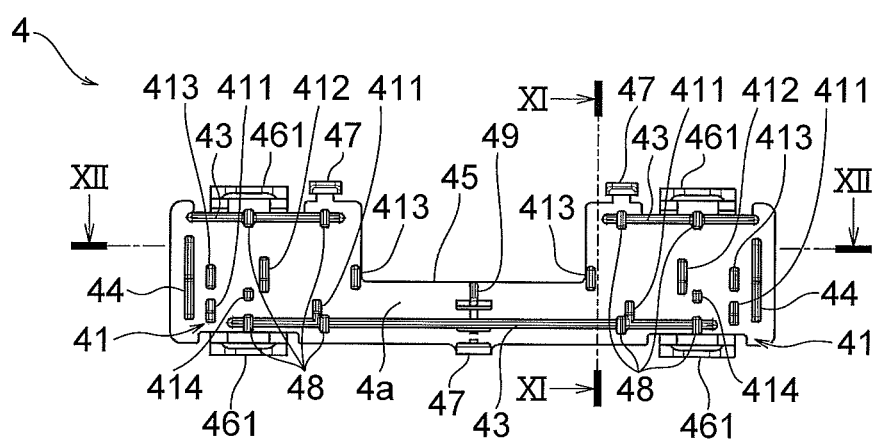
FIG. 9 is a back view of the cover constituting part of the electronic device.
Figure 10:
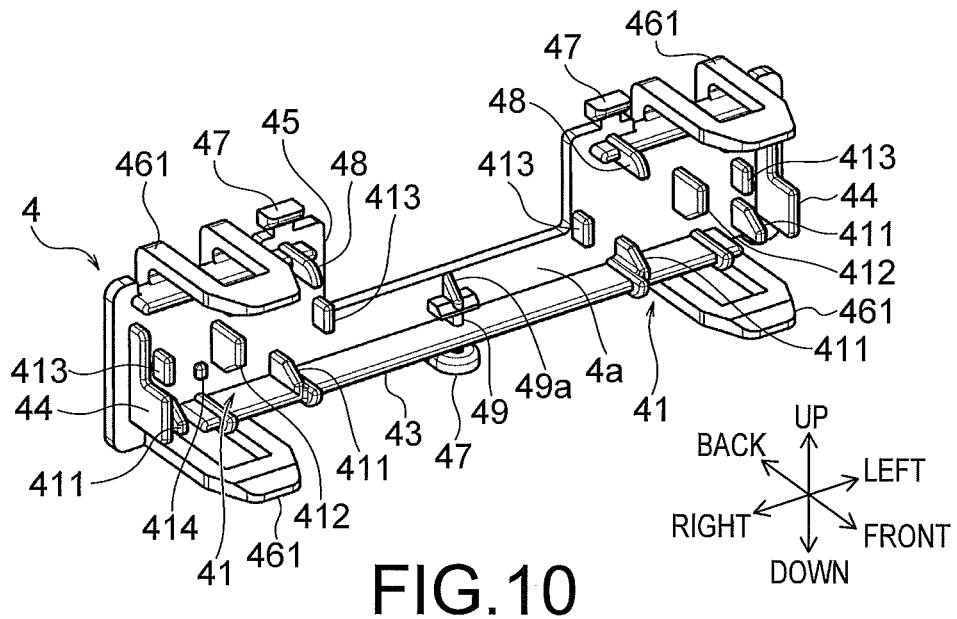
FIG. 10 is a back perspective view of the cover constituting part of the electronic device.
Figure 11:
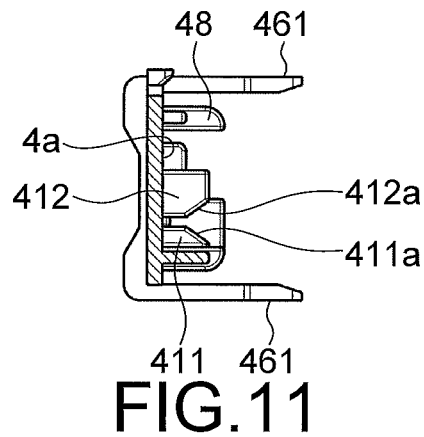
FIG. 11 is a cross sectional view taken along line XI-XI in FIG. 9.
Figure 12:
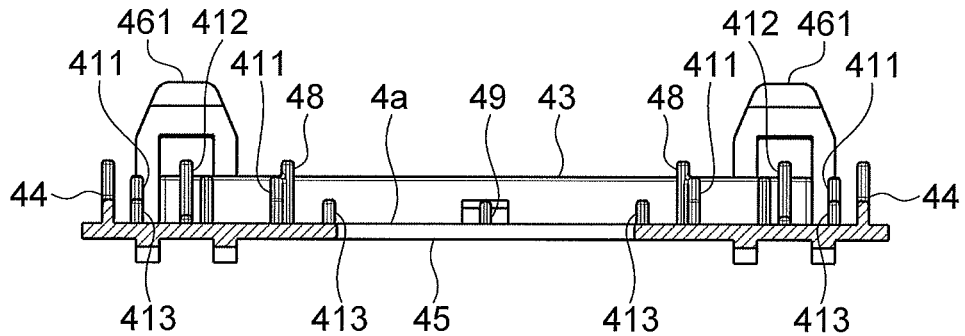
FIG. 12 is a cross sectional view taken along line XII-XII in FIG. 9.

As shown in FIGS. 8 to 10, the cover 4 is a flat-plate-shaped member which has a predetermined thickness in the longitudinal direction and extends in the lateral direction. The cover 4 is shaped like a flat plate large enough to close the case-side opening 31 of the case 3 and is fixed to the case 3 so as to close the case-side opening 31. The cover 4 includes a cover-side opening 45 which is provided at a laterally central position and three outer-side lugs 47 which are provided on two left and right sides of the cover-side opening 45 at an upper end of the cover 4 and at a lateral center at a lower end of the cover 4. The cover-side opening 45 is provided not at a vertical center of the cover 4 but at a position closer to an upper side and opens upward. The cover 4 further includes two sets of cover-side lockers 46 which are provided closer to left and right ends, respectively, than the three outer-side lugs 47. The two sets of cover-side lockers 46 each include two flat-plate-shaped lock arms 461 which extend frontward from the upper end and the lower end, respectively, of the cover 4. A lock hole 461a which extends in the vertical direction is formed in each of the two lock arms 461.

The cover 4 includes two sets of cover-side board holders 41 which are provided at a front surface 4a (an inner surface) of the cover 4, facing an inside of the case 3, when the cover 4 is fixed to the case 3. One set of cover-side board holders 41 is provided on two left and right sides at the front surface 4a of the cover 4. One set of cover-side board holders 41 includes, at the front surface 4a of the cover 4, two cover-side first holders 411 which are arranged with a predetermined distance therebetween in the lateral direction and one cover-side second holder 412 which is arranged between the two cover-side first holders 411.

As shown in FIGS. 9 to 12, the two cover-side first holders 411 are each shaped like a flat plate which extends frontward from the front surface 4a of the cover 4 and is provided with an orientation having the lateral direction as a thickness direction. The two cover-side first holders 411 are equal in a dimension extending frontward from the front surface 4*a* (see FIG. 12). Respective inclined surfaces 411*a* which incline downward toward a front are formed on front end sides of the two cover-side first holders 411 (see FIG. 11).

The cover-side second holder 412 is arranged between and above the two cover-side first holders 411 at the front surface 4*a* of the cover 4. Like the cover-side first holders 411, the cover-side second holder 412 is shaped like a flat plate which extends frontward from the front surface 4*a* and is provided with an orientation having the lateral direction as a thickness direction. A dimension extending frontward of the cover-side second holder 412 is equal to the dimensions extending frontward from the front surface 4*a* of the two cover-side first holders 411 (see FIG. 11). An inclined surface 412*a* which inclines upward toward the front is formed on a front end side of the cover-side second holder 412 (see FIG. 11). The two cover-side first holders 411 and the cover-side second holder 412 are arranged with a distance smaller than the thickness of the board 2 therebetween in the vertical direction. In other words, a distance in the vertical direction (a distance d2 shown in FIG. 19) between upper ends of the two cover-side first holders 411 and a lower end of the cover-side second holder 412 is a distance smaller than the thickness of the board 2.

One set of cover-side board holders 41 further includes, at the front surface 4*a* of the cover 4, two cover-side third holders 413 which are arranged at a position above the cover-side first holder 411 arranged on a left or right end side of the cover 4 and a position close to the cover-side opening 45. Like the holders 411 and 412, the two cover-side third holders 413 are each shaped like a flat plate which extends frontward from the front surface 4*a* and is provided with an orientation having the lateral direction as a thickness direction. Dimensions extending frontward of the cover-side third holders 413 are shorter than those of the cover-side first holders 411 (see FIG. 12). The cover-side first holder 411 and the cover-side third holder 413 arranged on the left or right end side of the cover 4 are arranged with a distance equal to (or slightly larger than) the thickness of the board 2 in the vertical direction. In other words, the board 2 can be inserted into between the upper end of the cover-side first holder 411 and a lower end of the cover-side third holder 413, and the board 2 is held between the cover-side first holder 411 and the cover-side third holder 413.

One set of cover-side board holders 41 further includes a convex board rear end positioning projection 414 which is arranged between the upper ends of the two cover-side first holders 411 and the lower end of the cover-side second holder 412 at the front surface 4*a* of the cover 4. The board rear end positioning projection 414 is arranged between the two cover-side first holders 411 and closer to the left or right end of the cover 4 than the cover-side second holder 412. The board rear end positioning projection 414 is configured to come into contact with the distal end side of the deformable arm 24*b* of the rear-side deformable device 24 at the board 2 to press the deformable arm 24*b* in a direction opposite to an insertion direction (frontward) when the board 2 is inserted into between the cover-side board holders 41 (see FIG. 22). Note that the board rear end positioning projection 414 may be changed in arrangement in the lateral direction to another position.

The cover 4 includes a plurality of inner-side lugs 48 which are provided on two upper and lower sides of the front surface 4*a* and a connector support 49 which is provided at a position close to the cover-side opening 45 at a lateral center at the front surface 4*a*. The plurality of inner-side lugs 48 are each shaped like a flat plate which extends frontward from the front surface 4*a*. The plurality of inner-side lugs 48 are configured to come close to (or come into contact with) inner surfaces of the upper and lower walls 3*c* and 3*b* of the case 3 and to, together with the above-described three outer-side lugs 47, hold the upper and lower walls 3*c* and 3*b* of the case 3 in the vertical direction when the cover 4 is fixed to the case 3. The connector support 49 is shaped like a flat plate which extends frontward from the front surface 4*a*. An inclined surface 49*a* which inclines downward toward the front is formed on a front end side of the connector support 49 (see FIG. 10). The connector support 49 is configured to come into contact with a lower end outer surface of the connector 22 at the board 2 housed in the case 3 to support the connector 22 when the cover 4 is fixed to the case 3. The cover 4 further includes, at the front surface 4*a*, a plurality of flat-plate-shaped reinforcers 43 which are provided to link the plurality of inner-side lugs 48 and flat-plate-shaped board insertion guides 44 which are provided closer to the left and right ends, respectively, than the two sets of cover-side board holders 41.

[Assembly of Electronic Device 1]

Assembly of the electronic device 1 with the above-described configuration will be described. As shown in FIG. 1, the electronic device 1 is assembled by inserting the board 2 through the case-side opening 31 into the case 3 and then fixing the cover 4 to the case 3 so as to close the case-side opening 31. Note that the electronic device 1 is also configured such that it is possible to assemble the board 2 and the cover 4 together and fix the cover 4 to the case 3 while inserting the board 2 in an assembled state into the case 3.

[Insertion of Board 2 into Case 3]

The board 2 passes through the case-side opening 31 in a direction from the front end 2*b* side along the mounting surface 2*a* and is inserted into the case 3. The board 2 is inserted while being guided so as to slide on upper ends of the left and right board insertion guides 35 inside the case 3. When the board 2 is inserted into the case 3, the front end 2*b* of the board 2 first comes into contact with the inclined surfaces 321*a* of the case-side first holders 321 arranged on the laterally central side of the case 3 in the left and right case-side board holders 32. After that, front ends of the deformable bases 23*a* of the left and right front-side deformable devices 23 at the board 2 come into contact with the inclined surfaces 321*a*, respectively, of the case-side first holders 321 arranged on the left wall 3*d* side and the right wall 3*e* side of the case 3 in the left and right case-side board holders 32. The board 2 is inserted into the case 3 while the front end 2*b* of the board 2 and the front ends of the left and right deformable bases 23*a* are pushed upward along the inclined surfaces 321*a*.

Figure 13:
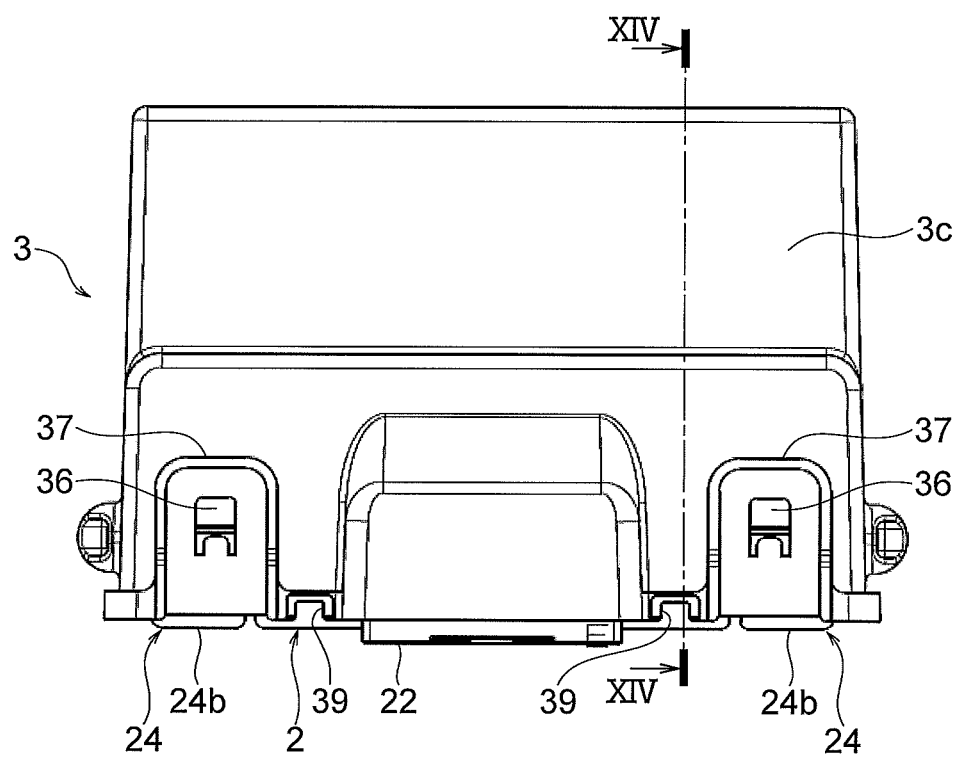
FIG. 13 is a plan view of the case and the board showing a first step in assembly of the board to the case.
Figure 14:
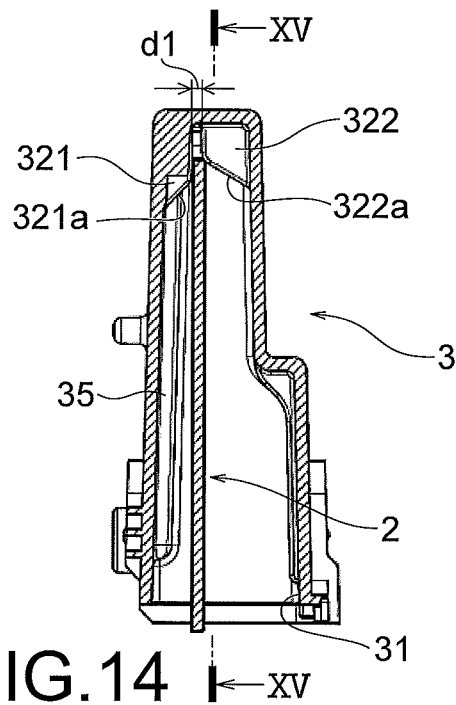
FIG. 14 is a cross sectional view taken along line XIV-XIV in FIG. 13.
Figure 15:
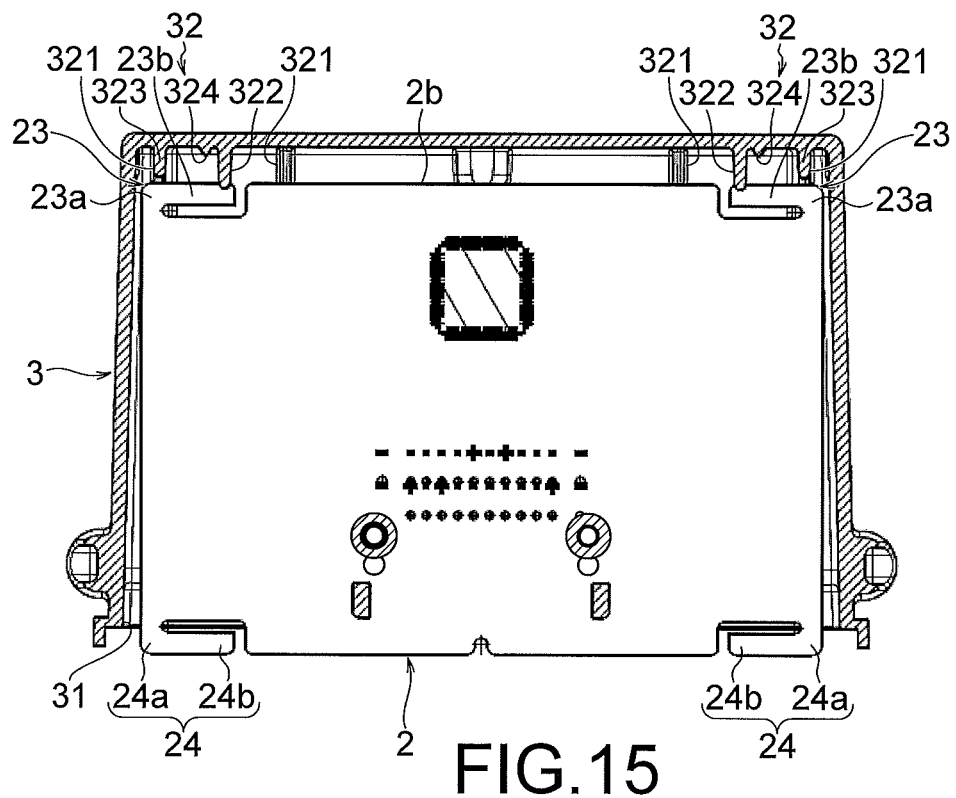
FIG. 15 is a cross sectional view of the case and the board taken along line XV-XV in FIG. 14.
Figure 16:
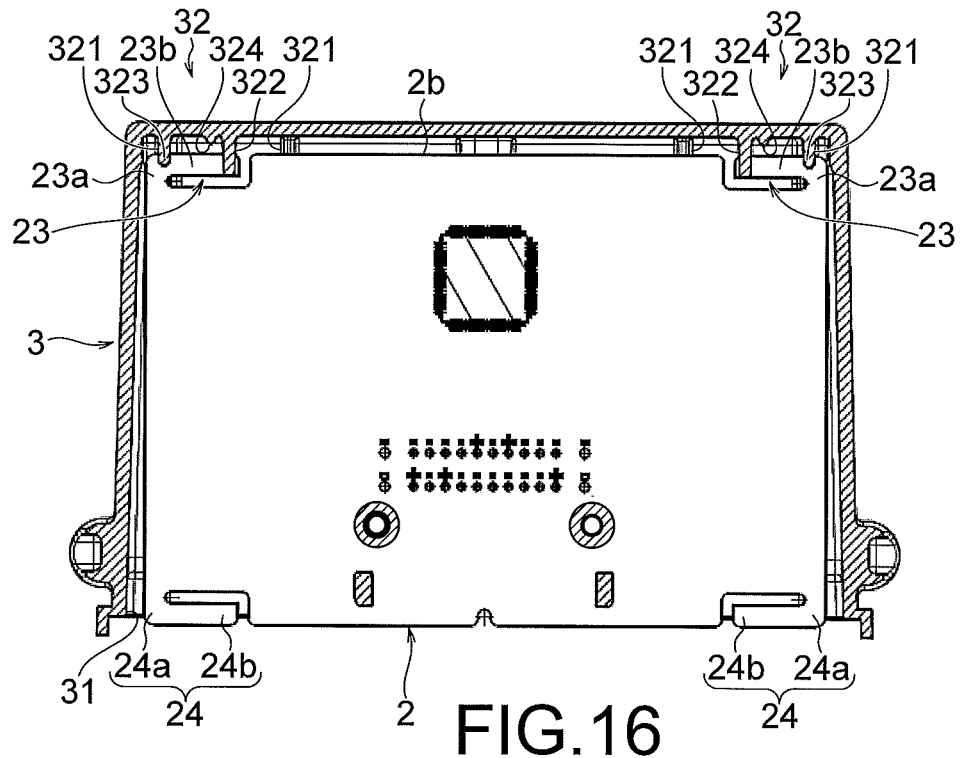
FIG. 16 is a cross sectional view of the case and the board taken along line XV-XV in FIG. 14, showing a second step in the assembly of the board to the case.
Figure 17:
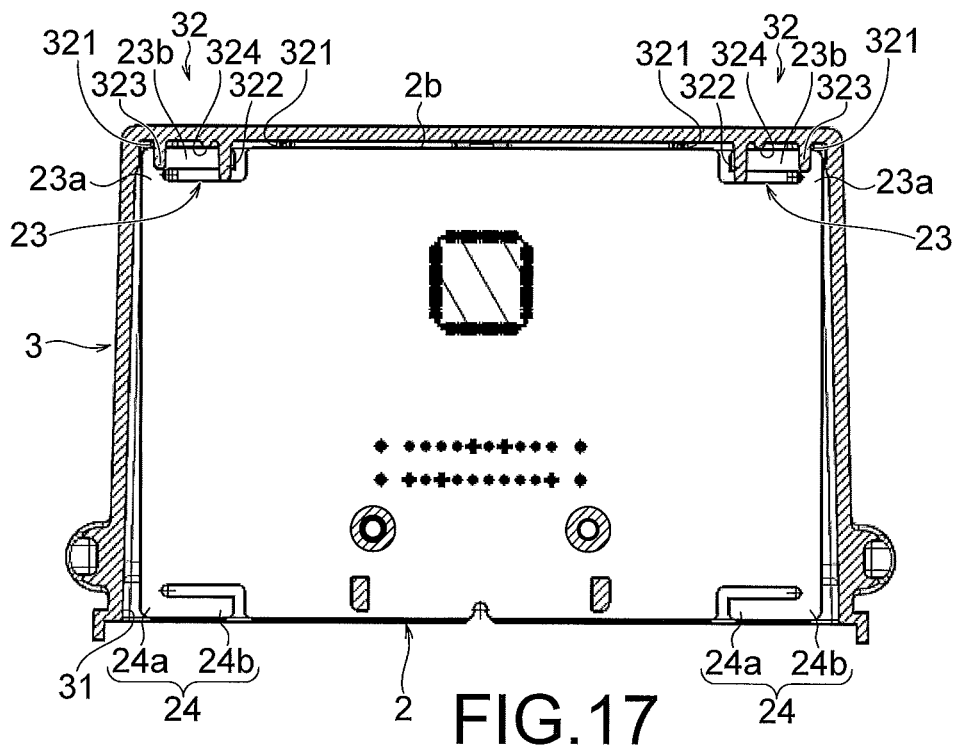
FIG. 17 is a plan view of the case and the board taken along line XV-XV in FIG. 14, showing a third step in the assembly of the board to the case.

When the board 2 is further inserted into the case 3, front ends on the free end sides of the deformable arms 23*b* in the left and right front-side deformable devices 23 come into contact with the inclined surfaces 322*a*, respectively, of the case-side second holders 322 in the left and right case-side board holders 32, as shown in FIGS. 13 to 15. The free end sides of the left and right deformable arms 23*b* are pushed downward along the inclined surfaces 322*a*. With the downward push, the front-side deformable devices 23 are elastically deformed such that the free end sides of the left and right deformable arms 23*b* move downward using, as a fulcrum, a portion of contact between a lower surface of each deformable base 23*a* and the upper end of the corresponding case-side first holder 321. After that, as shown in FIG. 16, the left and right deformable bases 23a are held between the upper ends of the case-side first holders 321 and the lower ends of the case-side third holders 323. As shown in FIG. 17, the board 2 is inserted into the case 3 until front ends of the left and right deformable arms 23b come into contact with the left and right board front end positioning projections 324. When the board 2 is inserted into the case 3, as described above, the front end 2b side of the board 2 is supported from below by the upper ends of the case-side first holders 321, the left and right deformable bases 23a are held between the case-side first holders 321 and the case-side third holders 323 in the vertical direction, and the left and right deformable arms 23b come into contact with the lower ends of the case-side second holders 322 in a state of being elastically deformed downward. With this configuration, the front end 2b side of the board 2 is held by the case 3.

[Fixation of Cover 4 to Case 3]

Figure 18:
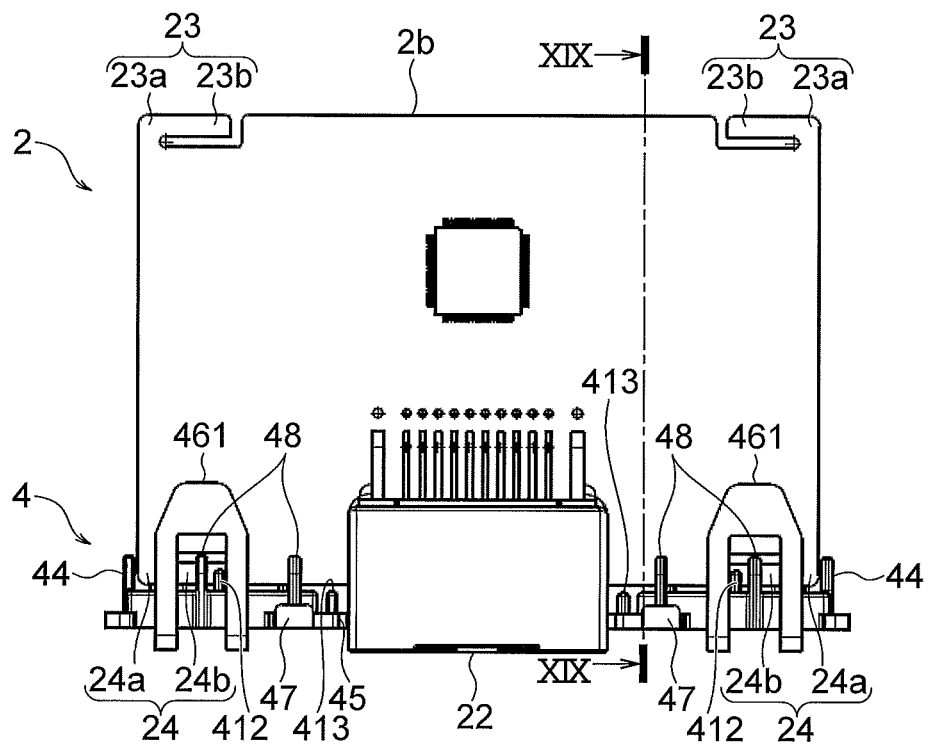
FIG. 18 is a plan view of the cover and the board showing a first step in assembly of the cover to the case.
Figure 19:
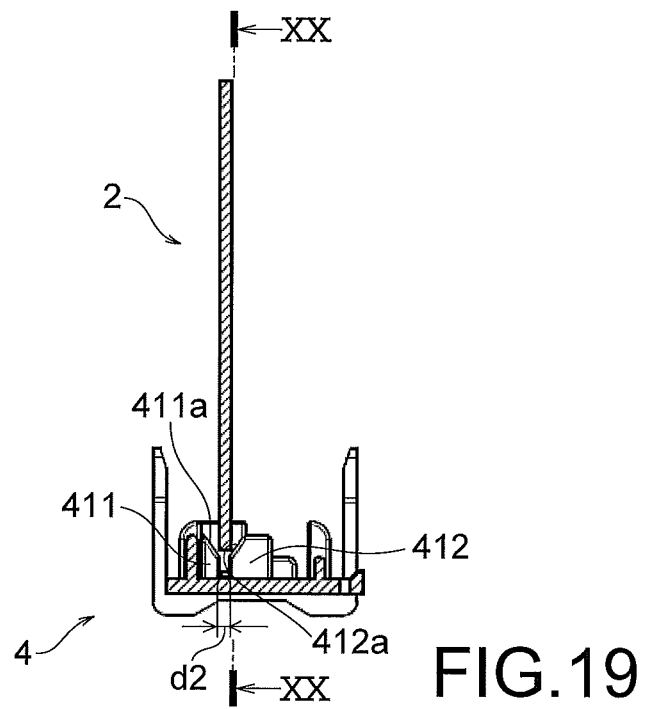
FIG. 19 is a cross sectional view taken along line XIX-XIX in FIG. 18.
Figure 20:
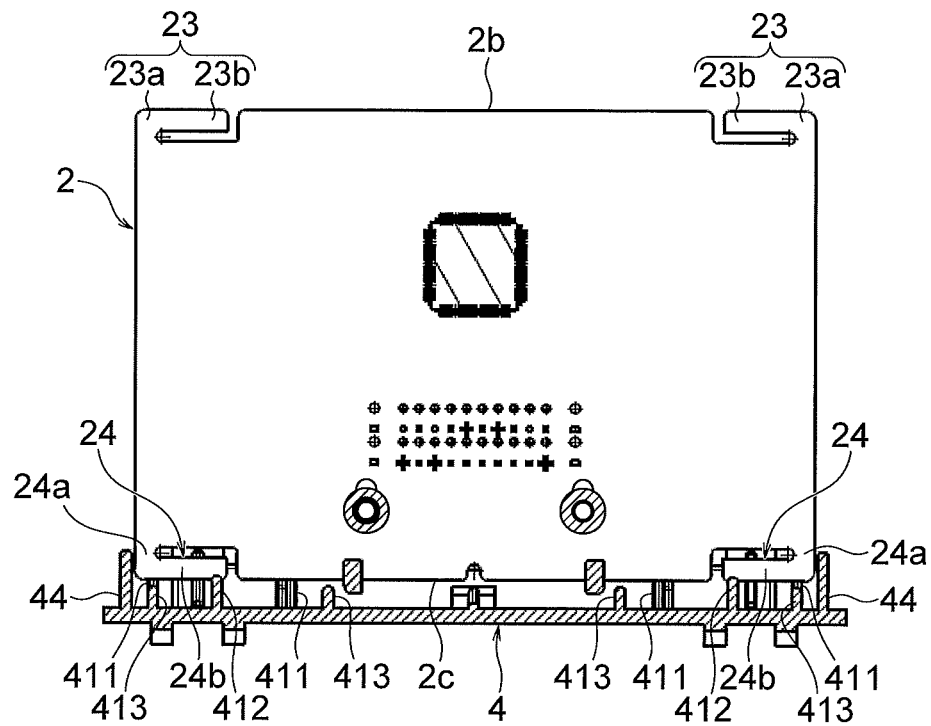
FIG. 20 is a cross sectional view of the cover and the board taken along line XX-XX in FIG. 19.

After the board 2 is inserted into the case 3, as described above, the cover 4 is fixed to the case 3 so as to close the case-side opening 31. When the cover 4 is brought closer to the case 3 in a state where the front surface 4a of the cover 4 is made to face the case-side opening 31, the inclined surfaces 411a of the cover-side first holders 411 in the left and right cover-side board holders 41 at the cover 4 come into contact with the rear end 2c of the board 2 inserted in the case 3 and rear ends of the deformable bases 24a of the left and right rear-side deformable devices 24, as shown in FIGS. 18 to 20. While the inclined surfaces 411a of the left and right cover-side first holders 411 are pushing the rear end 2c of the board 2 and the rear ends of the left and right deformable bases 24a upward along the inclined surfaces 411a, the front surface 4a of the cover 4 comes closer to the rear end 2c of the board 2. At this time, the inclined surface 49a of the connector support 49 at the cover 4 come into contact with the lower end outer surface of the connector 22 mounted on the board 2. While the inclined surface 49a of the connector support 49 is pushing the connector 22 upward along the inclined surface 49a, the inclined surface 49a guides the connector 22 such that the connection opening 22a of the connector 22 protrudes outward from the cover-side opening 45 of the cover 4. Additionally, inner side surfaces of the left and right board insertion guides 44 of the cover 4 come into contact with left and right ends of the board 2, thereby positioning the board 2 in the lateral direction.

Figure 21:
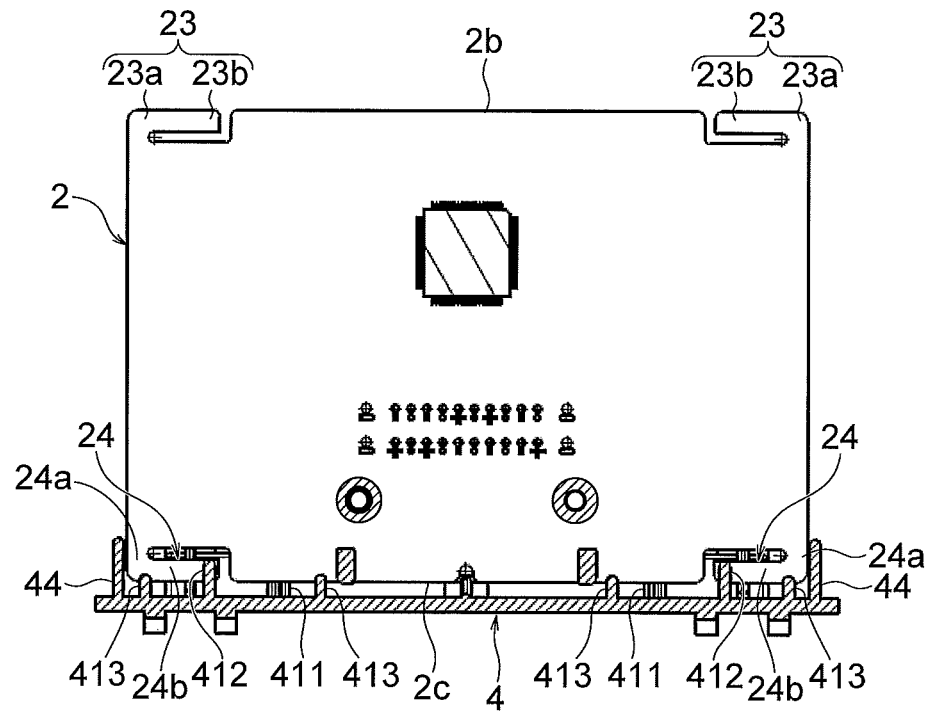
FIG. 21 is a cross sectional view of the cover and the board taken along line XX-XX in FIG. 19, showing a second step in the assembly of the cover to the case.
Figure 22:
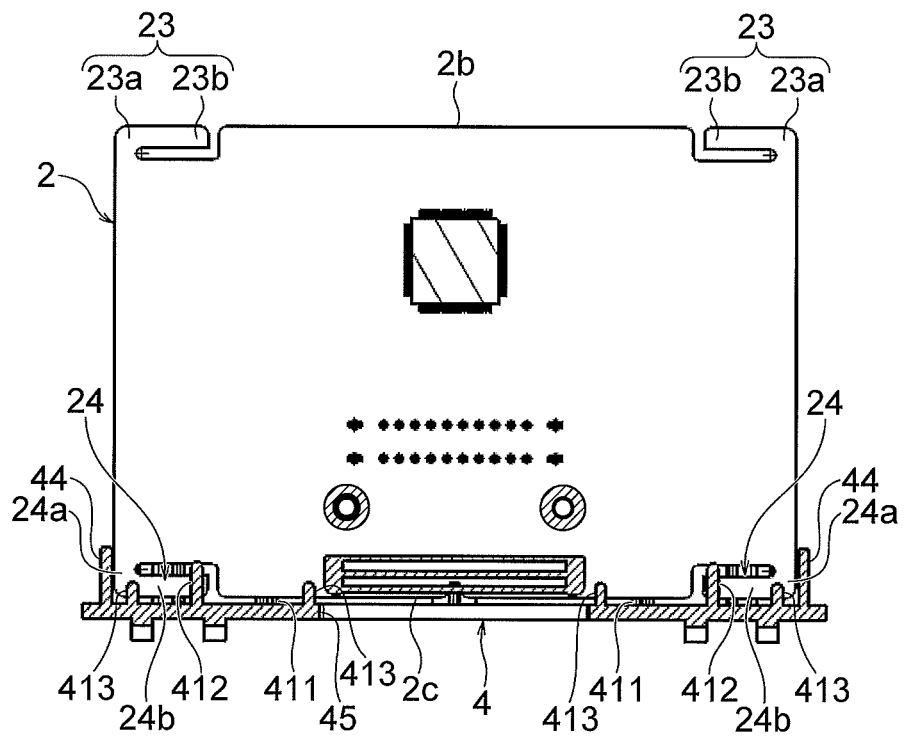
FIG. 22 is a cross sectional view of the cover and the board taken along line XX-XX in FIG. 19, showing a third step in the assembly of the cover to the case.

When the front surface 4a of the cover 4 comes further closer to the rear end 2c of the board 2, the inclined surfaces 412a of the cover-side second holders 412 in the left and right cover-side board holders 41 come into contact with rear ends on the free end sides of the deformable arms 24b of the left and right rear-side deformable devices 24 at the board 2, as shown in FIG. 21. The inclined surfaces 412a of the left and right cover-side second holders 412 push the free end sides of the left and right deformable arms 24b down along the inclined surfaces 412a. With the downward push of the free end sides of the deformable arms 24b, the rear-side deformable devices 24 are elastically deformed such that the free end sides of the left and right deformable arms 24b move downward using, as a fulcrum, a portion of contact between a lower surface of each deformable base 24a and the upper end of the corresponding cover-side first holder 411. After that, as shown in FIG. 22, the upper ends of the two cover-side first holders 411 and the lower ends of the two cover-side third holders 413 hold the rear end 2c of the board 2 and the deformable bases 24a in the vertical direction in the left and right cover-side board holders 41.

Additionally, the board rear end positioning projections 414 in the left and right cover-side board holders 41 come into contact with the rear ends on the free end sides of the left and right deformable arms 24b at the board 2. In this state, the rear end 2c side and the left and right deformable bases 24a at the board 2 are held between the cover-side first holders 411 and the cover-side third holders 413 in the vertical direction, and the left and right deformable arms 24b come into contact with the lower ends of the cover-side second holders 412 in a state of being elastically deformed downward. With this configuration, the rear end 2c side of the board 2 is held by the cover 4.

Figure 23:
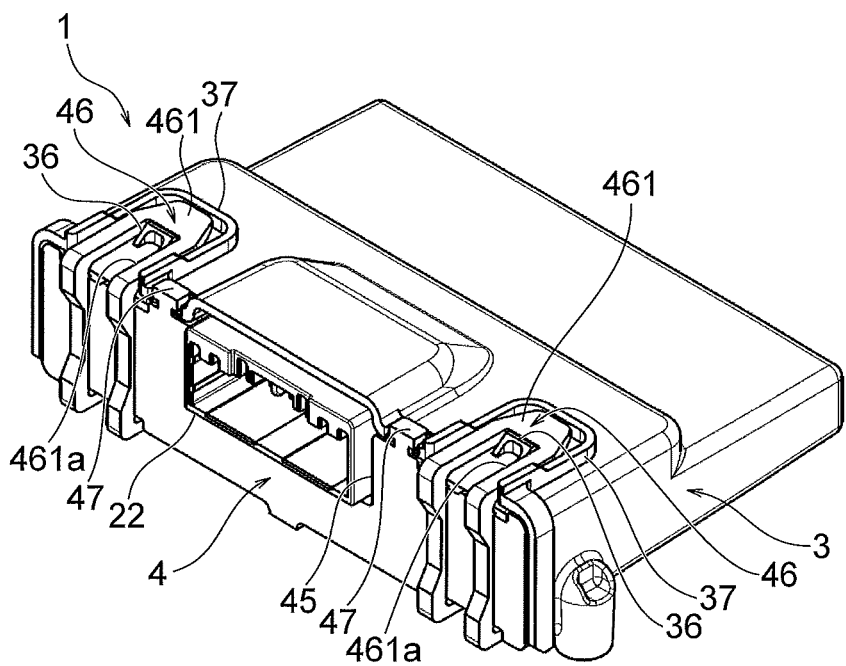
FIG. 23 is a perspective view showing the electronic device according to the first embodiment.

As for the fixation of the cover 4 to the case 3, the left and right case-side lockers 36 at the case 3 are inserted into and brought into engagement with the lock holes 461a of the left and right cover-side lockers 46 at the cover 4, thereby fixing the cover 4 to the case 3, as shown in FIG. 23. In a storage space formed through the fixation of the cover 4 to the case 3, as described above, the front end 2b side of the board 2 is supported from below by the case-side first holders 321, the left and right deformable bases 23a are held between the case-side first holders 321 and the case-side third holders 323 in the vertical direction, and the left and right deformable arms 23b come into contact with the lower ends of the case-side second holders 322 in a state of being elastically deformed downward. With this configuration, the front end 2b side of the board 2 is held by the case 3. Additionally, the rear end 2c side and the left and right deformable bases 24a at the board 2 are held between the cover-side first holders 411 and the cover-side third holders 413 in the vertical direction, and the left and right deformable arms 24b come into contact with the lower ends of the cover-side second holders 412 in a state of being elastically deformed downward. With this configuration, the rear end 2c side of the board 2 is held by the cover 4. In addition, the left and right deformable arms 23b of the front-side deformable devices 23 and the left and right deformable arms 24b of the rear-side deformable devices 24 are depressed in the longitudinal direction by the board front end positioning projections 324 and the board rear end positioning projections 414. With this configuration, the board 2 is held in a state of being restricted in movement in the longitudinal direction in the storage space. As described above, the board 2 is held in a fixed state in the storage space formed through fixation of the cover 4 to the case 3.

As has been described above, in the electronic device 1 according to the first embodiment, each of the deformable devices 23 and the deformable devices 24 formed at the board 2 is brought into contact with the case 3 or the cover 4 in a state of being elastically deformed when the board 2 is housed in the storage space formed through fixation of the cover 4 to the case 3. This allows holding of the board 2 in the storage space by use of elastic force of the deformable devices 23 and 24 in directions which eliminate elastic deformation. It is thus possible to prevent the board 2 from shaking in the case 3 to generate an unusual noise.

In the electronic device 1 according to the first embodiment, when the board 2 is inserted through the case-side opening 31 into the case 3 in a direction along the mounting surface 2a, the deformable arms 23b of the front-side deformable devices 23 formed at the front end 2b that is an insertion leading end of the board 2 are elastically deformed by coming into contact with the case-side second holders 322 of the case-side board holders 32 provided at the inner surface of the front wall 3a of the case 3, facing the case-side opening 31. For this reason, insertion of the board 2 into the case 3 and holding of the board 2 in the case 3 by use of elastic deformation of the front-side deformable devices 23 can be simultaneously performed. It is thus possible to efficiently assemble the electronic device 1.

In the electronic device 1 according to the first embodiment, when the cover 4 is fixed to the case 3, the deformable arms 24b of the rear-side deformable devices 24 formed at the rear end 2c located on a side with the cover 4 of the board 2 inserted in the case 3 are elastically deformed by coming into contact with the cover-side second holders 412 of the cover-side board holders 41 provided at the inner surface of the cover 4. For this reason, fixation of the cover 4 to the case 3 and holding of the rear end 2c side of the board 2 by use of elastic deformation of the rear-side deformable devices 24 can be simultaneously performed. It is thus possible to efficiently assemble the electronic device 1.

In the electronic device 1 according to the first embodiment, one front-side deformable device 23 is formed on each of two sides in the lateral direction along the mounting surface 2a at the front end 2b of the board 2, and one rear-side deformable device 24 is formed on each of the two sides in the lateral direction along the mounting surface 2a at the rear end 2c of the board 2. Since holding of the board 2 by use of elastic force of the deformable devices 23 and 24 can be performed on the two end sides in the lateral direction of the board 2, the board 2 can be stably held. Additionally, the front-side deformable devices 23 and the rear-side deformable devices 24 are formed by making cuts L-shaped in plan view on the end 2b side and the end 2c side of the board 2. It is thus possible to easily form the front-side deformable devices 23 and the rear-side deformable devices 24 in a shape suitable for elastic deformation without complicating a shape of a die for shaping the deformable devices 23 and 24.

In the electronic device 1 according to the first embodiment, when the board 2 is inserted into the case 3, the front end 2b side of the board 2 is held by the two case-side first holders 321, and each front-side deformable device 23 is elastically deformed by being pressed by the case-side second holder 322 arranged between the two case-side first holders 321 at a distance smaller than the thickness of the board 2 in the thickness direction of the board 2 from the case-side first holders 321. It is thus possible to press each front-side deformable device 23 with the case-side second holder 322 between two points while supporting the board 2 at the two points with the two case-side first holders 321 and stably elastically deform the front-side deformable device 23. This allows stable holding of the board 2.

In the electronic device 1 according to the first embodiment, when the cover 4 is fixed to the case 3, the rear end 2c side of the board 2 is held by the two cover-side first holders 411, and each rear-side deformable device 24 is elastically deformed by being pressed by the cover-side second holder 412 arranged between the two cover-side first holders 411 at a distance smaller than the thickness of the board 2 in the thickness direction of the board 2 from the cover-side first holders 411. It is thus possible to press each rear-side deformable device 24 with the cover-side second holder 412 between two points while supporting the board 2 at the two points with the two cover-side first holders 411 and stably elastically deform the rear-side deformable device 24. This allows stable holding of the board 2.

The first embodiment of the present invention has been described so far. The embodiment is illustrative only, and the present invention is not limited to the embodiment. For example, although the front-side deformable devices 23 and the rear-side deformable devices 24 are formed at two ends of the front end 2b and the rear end 2c at the board 2 in the first embodiment, deformable devices may be formed at either one of the front end 2b and the rear end 2c. Various modifications, replacements, omissions, and the like as described below can be made without departing from the spirit of the present invention.

Second Embodiment

Figure 24:
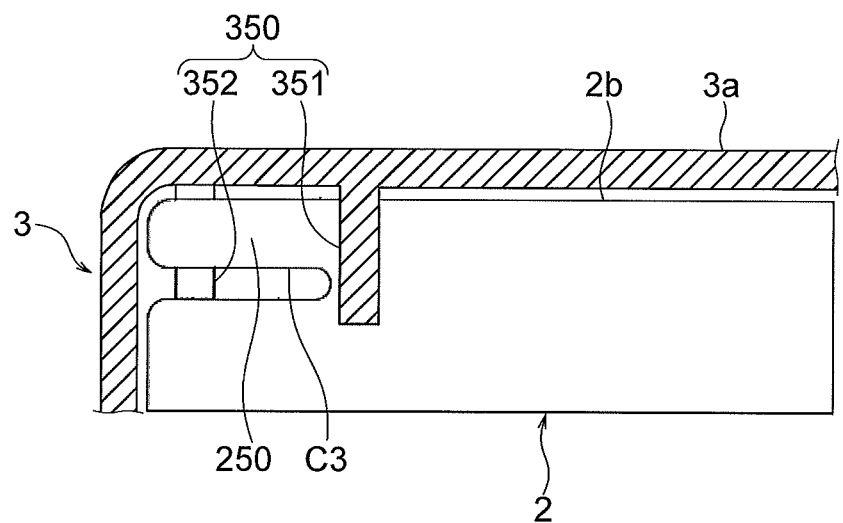
FIG. 24 is a cross sectional view showing a deformable device formed at a board and case-side board holders in an electronic device according to a second embodiment.

As shown in FIG. 24, a deformable device to be formed at a board 2 may be formed by making a notch C3 extending linearly from an end of the board 2. A deformable device 250 which is formed on a side with a front end 2b of the board 2 is cantilevered to extend in a lateral direction with respect to the board 2. Case-side board holders 350 which are provided at an inner surface of a front wall 3a of a case 3 include one case-side first holder 351 and one case-side second holder 352. When the board 2 is inserted into the case 3, a free end side of the deformable device 250 is pushed upward along an inclined surface of the case-side second holder 352 by coming into contact with the inclined surface. With the upward push, the deformable device 250 is elastically deformed such that the free end side of the deformable device 250 moves upward using, as a fulcrum, a portion of contact between the front end 2b side of the board 2 and a lower end of the case-side first holder 351. In the above-described manner, the front end 2b side of the board 2 is supported from above by the case-side first holder 351, and the free end side of the deformable device 250 comes into contact with an upper end of the case-side second holder 352 in a state of being elastically deformed upward. With this configuration, the front end 2b side of the board 2 is held by the case 3. According to the configuration, as in the first embodiment, the board 2 can be held in the case 3 without shakes, using elastic deformation of the deformable device 250. Additionally, provision of the linear notch C3 simpler than the L-shaped notch C1 allows easier formation of the deformable device 250. Note that configurations similar to those of the deformable device 250 and the case-side board holders 350 may be adopted for a deformable device to be formed on a side with a rear end 2c of the board 2 and a cover-side board holder to be formed at a cover 4.

Third Embodiment

Figure 25:
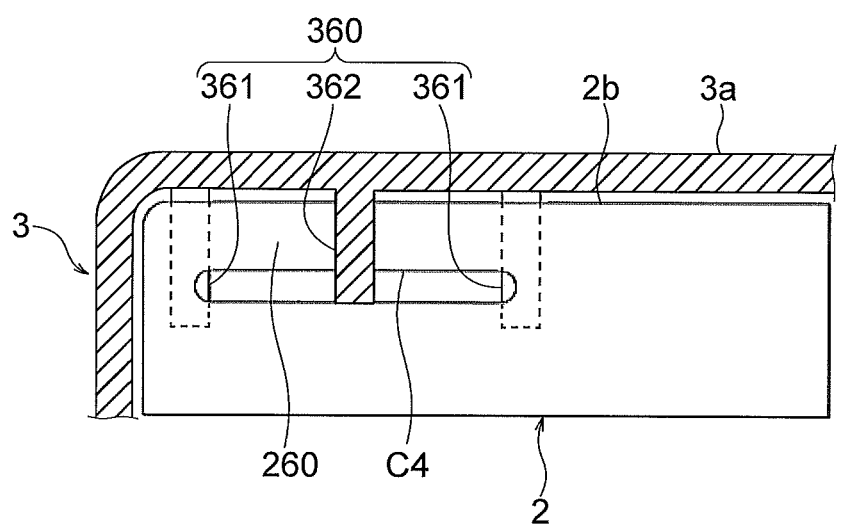
FIG. 25 is a cross sectional view showing a deformable device formed at a board and case-side board holders in an electronic device according to a third embodiment.

As shown in FIG. 25, a deformable device to be formed at a board 2 may be formed by making a notch C4 extending linearly in an inner portion of the board 2 on an end side of the board 2. A deformable device 260 which is formed on a side with a front end 2b of the board 2 is shaped like a flat plate which includes the front end 2b of the board 2 and extends in a lateral direction. Case-side board holders 360 which are provided at an inner surface of a front wall 3a of a case 3 include two case-side first holders 361 and one case-side second holder 362. When the board 2 is inserted into the case 3, a lateral center of the deformable device 260 is pushed downward along an inclined surface of the case-side second holder 362 by coming into contact with the inclined surface. With the downward push, the deformable device 260 is elastically deformed such that the lateral center of the deformable device 260 moves downward using, as fulcrums, portions of contact between the front end 2b side of the board 2 and upper ends of the two case-side first holders 361. In the above-described manner, the front end 2b side of the board 2 is supported from below by the two case-side first holders 361, and the lateral center of the deformable device 260 comes into contact with a lower end of the case-side second holder 362 in a state of being elastically deformed downward. With this configuration, the front end 2*b* side of the board 2 is held by the case 3. According to the configuration, as in the first embodiment, the board 2 can be held in the case 3 without shakes, using elastic deformation of the deformable device 260. Note that configurations similar to those of the deformable device 260 and the case-side board holders 360 may be adopted for a deformable device to be formed on a side with a rear end 2*c* of the board 2 and a cover-side board holder to be formed at a cover 4.

Fourth Embodiment

Figure 26:
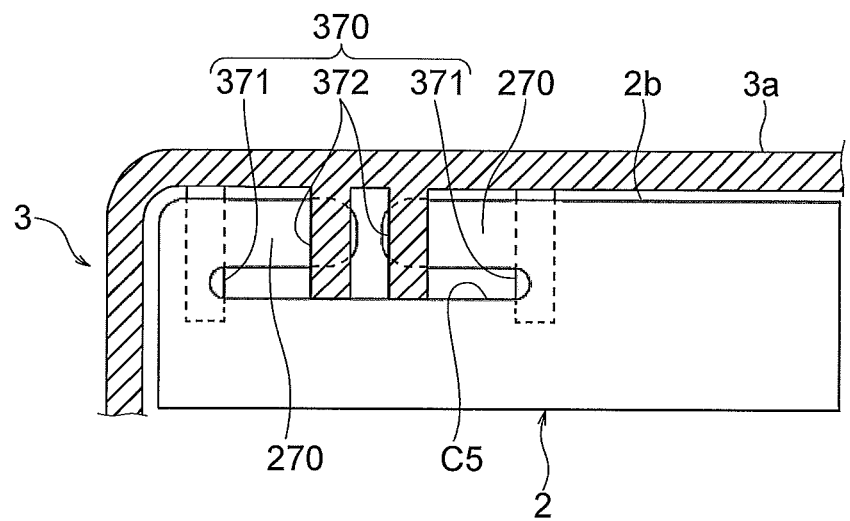
FIG. 26 is a cross sectional view showing deformable devices formed at a board and case-side board holders in an electronic device according to a fourth embodiment.

As shown in FIG. 26, deformable devices to be formed at a board 2 may be formed by making a notch C5 T-shaped in plan view in a front end 2*b* of the board 2. Two deformable devices 270 which are formed on a side with the front end 2*b* of the board 2 are each cantilevered to extend in a lateral direction with respect to the board 2. The two deformable devices 270 are provided with respective free ends facing each other. Case-side board holders 370 which are provided at an inner surface of a front wall 3*a* of a case 3 include two case-side first holders 371 and two case-side second holders 372. The two case-side second holders 372 may be integral with each other. When the board 2 is inserted into the case 3, the two deformable devices 270 come into contact with respective inclined surfaces of the case-side second holders 372, thereby pushing free end sides of the two deformable devices 270 downward along the inclined surfaces. With the downward push, the two deformable devices 270 are elastically deformed such that the free end sides of the deformable devices 270 move upward using, as fulcrums, portions of contact between the front end 2*b* side of the board 2 and upper ends of the two case-side first holders 371. In the above-described manner, the front end 2*b* side of the board 2 is supported from below by the two case-side first holders 371, and the free end sides of the two deformable devices 270 come into contact with lower ends of the case-side second holders 372 in a state of being elastically deformed downward. With this configuration, the front end 2*b* side of the board 2 is held by the case 3. According to the configuration, as in the first embodiment, the board 2 can be held in the case 3 without shakes, using elastic deformation of the two deformable devices 270. Note that configurations similar to those of the deformable devices 270 and the case-side board holders 370 may be adopted for a deformable device to be formed on a side with a rear end 2*c* of the board 2 and a cover-side board holder to be formed at a cover 4. 12

Fifth Embodiment

Figure 27:
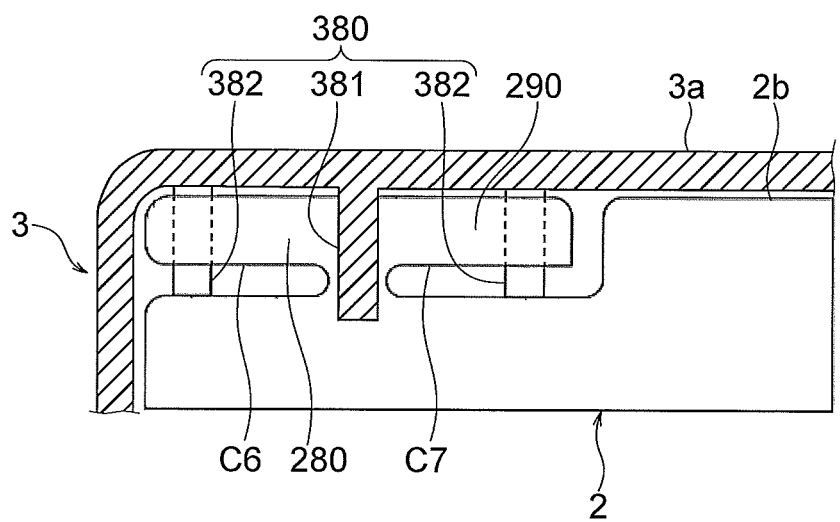
FIG. 27 is a cross sectional view showing deformable devices formed at a board and case-side board holders in an electronic device according to a fifth embodiment.

As shown in FIG. 27, deformable devices to be formed at a board 2 may be formed by making a notch C6 extending linearly from an end of the board 2 and a notch C7 L-shaped in plan view. Two deformable devices 280 and 290 which are formed on a side with a front end 2*b* of the board 2 are each cantilevered to extend in a lateral direction with respect to the board 2. The two deformable devices 280 and 290 are provided with respective fixed ends facing each other. Case-side board holders 380 which are provided at an inner surface of a front wall 3*a* of a case 3 include one case-side first holder 381 and two case-side second holders 382. When the board 2 is inserted into the case 3, free end sides of the two deformable devices 280 and 290 are pushed upward along respective inclined surfaces of the case-side second holders 382 by coming into contact with the inclined surfaces. With the upward push, the two deformable devices 280 and 290 are elastically deformed such that the free end sides of the two deformable devices 280 and 290 move upward using, as a fulcrum, a portion of contact between the front end 2*b* side of the board 2 and a lower end of the case-side first holder 381. In the above-described manner, the front end 2*b* side of the board 2 is supported from above by the case-side first holder 381, and the free end sides of the two deformable devices 280 and 290 come into contact with upper ends of the case-side second holders 382 in a state of being elastically deformed upward. With this configuration, the front end 2*b* side of the board 2 is held by the case 3. According to the configuration, as in the first embodiment, the board 2 can be held in the case 3 without shakes, using elastic deformation of the two deformable devices 280 and 290. Note that configurations similar to those of the deformable devices 280 and 290 and the case-side board holders 380 may be adopted for a deformable device to be formed on a side with a rear end 2*c* of the board 2 and a cover-side board holder to be formed at a cover 4.

Sixth Embodiment

Figure 28:
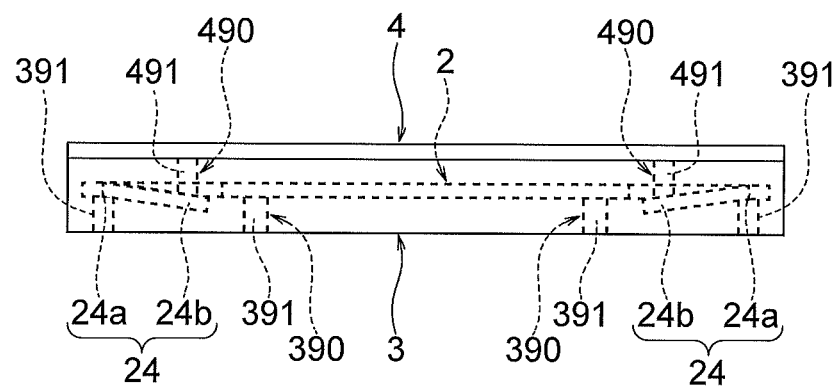
FIG. 28 is a schematic view schematically showing an electronic device according to a sixth embodiment.

As schematically shown in FIG. 28, a case 3 may be a box-shaped member which opens upward, and a cover 4 may be fixed to the case 3 so as to close an upper opening of the case 3. Two sets of case-side board holders 390 which are provided on two left and right sides at an inner surface of the case 3 each include two case-side holders 391. Two sets of cover-side board holders 490 which are provided on two left and right sides at an inner surface of the cover 4 each include one cover-side holder 491. When a board 2 is inserted through the upper opening of the case 3 into the case 3, deformable bases 24*a* on two left and right sides of the board 2 are supported from below by the two case-side holders 391. When the cover 4 is fixed to the case 3 so as to close the upper opening of the case 3, lower ends of the left and right cover-side holders 491 at the cover 4 come into contact with upper surfaces, respectively, on free end sides of left and right deformable arms 24*b* of the board 2, thereby pushing the free end sides of the left and right deformable arms 24*b* downward. With the downward push, the left and right deformable arms 24*b* are elastically deformed such that the free end sides of the left and right deformable arms 24*b* move downward using, as fulcrums, portions of contact between lower surfaces of the deformable bases 24*a* and the case-side holders 391. In the above-described manner, a side with a rear end 2*c* of the board 2 and the left and right deformable arms 24*b* are supported from below by the case-side holders 391, and the free end sides of the left and right deformable arms 24*b* come into contact with the lower ends, respectively, of the cover-side holders 491 in a state of being elastically deformed downward. With this configuration, the rear end 2*c* side of the board 2 is held by the case 3. Configurations similar to those of the case-side and cover-side board holders 390 and 490 are adopted for case-side and cover-side board holders which hold the front end 2*b* side of the board 2. According to the configuration, as in the first embodiment, the board 2 can be held in the case 3 without shakes, using elastic deformation of the left and right rear-side deformable devices 24. Note that a configuration similar to those of the deformable devices described in the second to fifth embodiments may be adopted for a deformable device to be formed at the board 2.

The invention claimed is:

1. An electronic device comprising:
a board having a mounting surface for an electronic component;
a case having an opening for insertion of the board into the case and configured to house the board inserted through the opening; and
a cover fixed to the case so as to close the opening,
wherein the board has at least one deformable device formed on an end side of the board and configured to be elastically deformable in a direction orthogonal to the mounting surface, and
the deformable device comes into contact with the case or the cover in a state of being elastically deformed to hold the board in a fixed state in a storage space formed through fixation of the cover to the case when the board is housed in the storage space.

2. The electronic device according to claim 1, wherein
the deformable device is formed on an insertion leading end side of the board when the board is inserted into the case in a direction along the mounting surface,
the case has a case-side board holder provided at an inside of the case which faces the opening, and
the deformable device comes into contact with the case-side board holder to be elastically deformed by the case-side board holder when the board is inserted into the case.

3. The electronic device according to claim 2, wherein
the case-side board holder includes
two first holders configured to extend from an inner surface of the case which faces the opening toward the opening, and
at least one second holder configured to extend from the inner surface of the case toward the opening at a position between the two first holders,
the two first holders and the second holder are arranged with a distance smaller than a thickness of the board inserted in the case between the two first holders and the second holder in a thickness direction of the board, and
an insertion leading end side of the board is supported by the two first holders, and the deformable device is pressed by the second holder to be elastically deformed when the board is inserted into the case.

4. The electronic device according to claim 1, wherein
the deformable device is formed on an end side of the board which is located on a side with the cover when the board is housed in the storage space,
the cover has a cover-side board holder provided on an inner side of the cover which faces the storage space when the cover is fixed to the case, and
the deformable device of the board inserted in the case comes into contact with the cover-side board holder to be elastically deformed by the cover-side board holder when the cover is fixed to the case.

5. The electronic device according to claim 4, wherein
the cover-side board holder includes
two first holders configured to extend from an inner side surface of the cover which faces the storage space when the cover is fixed to the case toward the storage space, and
at least one second holder configured to extend from the inner side surface of the cover toward the storage space at a position between the two first holders,
the two first holders and the second holder are arranged with a distance smaller than a thickness of the board inserted in the case between the two first holders and the second holder in a thickness direction of the board, and
the end side of the board located on the side with the cover is supported by the two first holders, and the deformable device is pressed by the second holder to be elastically deformed when the cover is fixed to the case.

6. The electronic device according to claim 1, wherein
the case has a case-side board holder provided at an inside of the case which faces the opening,
the cover has a cover-side board holder provided on an inner side of the cover which faces the storage space when the cover is fixed to the case, and
the deformable device of the board inserted in the case comes into contact with the case-side board holder and the cover-side board holder in a state of being held in the case-side board holder and the cover-side board holder to be elastically deformed when the cover is fixed to the case.

7. The electronic device according to claim 1,
wherein
one of the at least one deformable device is formed on each of two sides in a direction along the mounting surface at an end of the board.

8. The electronic device according to claim 1, wherein
the deformable device is formed by making a notch L-shaped in plain view in the end side of the board.

9. The electronic device according to claim 1, wherein
the deformable device is formed by making a notch T-shaped in plain view in the end side of the board.

* * * * *